United States Patent
Wan et al.

(10) Patent No.: US 11,828,958 B2
(45) Date of Patent: Nov. 28, 2023

(54) DISPLAY DEVICE AND MANUFACTURING METHOD THEREOF

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Bin Wan, Beijing (CN); Min Li, Beijing (CN); Yuanhong Peng, Beijing (CN); Ruilin Bi, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 571 days.

(21) Appl. No.: 16/954,057

(22) PCT Filed: Dec. 26, 2019

(86) PCT No.: PCT/CN2019/128540
§ 371 (c)(1),
(2) Date: Jun. 15, 2020

(87) PCT Pub. No.: WO2020/140817
PCT Pub. Date: Jul. 9, 2020

(65) Prior Publication Data
US 2021/0247553 A1   Aug. 12, 2021

(30) Foreign Application Priority Data

Jan. 4, 2019   (CN) .......................... 201910008970.9

(51) Int. Cl.
G02B 5/04 (2006.01)
G03F 7/00 (2006.01)
(Continued)

(52) U.S. Cl.
CPC ............ G02B 5/045 (2013.01); G03F 7/0007 (2013.01); G02F 1/133562 (2021.01); H10K 50/858 (2023.02)

(58) Field of Classification Search
CPC .. G02B 5/045; G03F 7/0007; G02F 1/133562
See application file for complete search history.

(56) References Cited

U.S. PATENT DOCUMENTS

2002/0097358 A1* 7/2002 Ueki ................. G02F 1/133504
349/113
2004/0263039 A1* 12/2004 Takei ................. H01L 51/5281
313/111
(Continued)

FOREIGN PATENT DOCUMENTS

CN   1987606 A    6/2007
CN   101975995 A  2/2011
(Continued)

OTHER PUBLICATIONS

First Office Action for Chinese Application No. 201910008970.9, dated Feb. 6, 2020, 8 Pages.
(Continued)

*Primary Examiner* — Lucy P Chien
(74) *Attorney, Agent, or Firm* — BROOKS KUSHMAN P.C.

(57) ABSTRACT

A display device and a manufacturing method thereof are provided. The display device includes a display panel and an optical modulation component on a light-emitting side of the display panel; the display panel includes multiple pixel units, the optical modulation component includes multiple (Continued)

optical modulation units in one-to-one correspondence with the multiple pixel units, and each optical modulation unit includes multiple prisms; and the prism is configured to refract light emitted from the corresponding pixel units so that the refracted light exits at a preset angle.

13 Claims, 3 Drawing Sheets

(51) Int. Cl.
 *G02F 1/1335* (2006.01)
 *H10K 50/858* (2023.01)

(56) References Cited

U.S. PATENT DOCUMENTS

2007/0212533 A1* 9/2007 Jones .................. G02B 6/0053
525/330.3

2019/0302329 A1 10/2019 Jin et al.
2020/0033515 A1 1/2020 Li et al.

FOREIGN PATENT DOCUMENTS

| CN | 205281069 U | 6/2016 |
| CN | 105911690 A | 8/2016 |
| CN | 106249492 A | 12/2016 |
| CN | 108469642 A | 8/2018 |
| CN | 108919403 A | 11/2018 |
| CN | 109448578 A | 3/2019 |
| JP | 2002202405 A | 7/2002 |
| JP | 2005148440 A | 6/2005 |

OTHER PUBLICATIONS

International Search Report and Written Opinion for Application No. PCT/CN2019/128540, dated Mar. 26, 2020, 11 Pages.

* cited by examiner

DISPLAY DEVICE AND MANUFACTURING METHOD THEREOF

CROSS-REFERENCE TO RELATED APPLICATIONS

This application is the U.S. national phase of PCT Application No. PCT/CN2019/128540 filed on Dec. 26, 2019, which claims priority to Chinese Patent Application No. 201910008970.9 filed on Jan. 4, 2019, which are incorporated herein by reference in their entireties.

TECHNICAL FIELD

The present disclosure relates to the field of display technology, and in particular to a display device and a manufacturing method thereof.

BACKGROUND

With the development of display technology, increasingly high demand on performance of display devices is required by people, and users desire that privacy of personal information can be effectively protected when using a display device.

However, an anti-peeping method for a display device in the related technologies reduces the utilization rate of light energy.

SUMMARY

The present disclosure provides a display device including a display panel and an optical modulation component on a light-emitting side of the display panel;
the display panel includes multiple pixel units, the optical modulation component includes multiple optical modulation units in one-to-one correspondence with the multiple pixel units, and each of the multiple optical modulation units includes multiple prisms; and
the prism is configured to refract light emitted by the corresponding pixel unit so that the refracted light exits at a preset angle.

In some embodiments of the present disclosure, the preset angle is an angle between light exiting from a light-exiting surface of the prism and a normal line of the display panel, and the preset angle ranges from 0 degree to 45 degrees.

In some embodiments of the present disclosure, for any one of the multiple optical modulation units: when any two of the prisms have different distances from a centerline of the corresponding pixel unit in a first direction, first angles of the any two prisms are different, the first angle is an angle between a light-entering surface of the prism and the light-exiting surface of the prism.

In some embodiments of the present disclosure, for any one of the multiple optical modulation units: the multiple prisms have same horizontal lengths in the second direction, and when any two prisms have different distances from the centerline of the corresponding pixel unit in the first direction, the any two prisms have different vertical heights in the first direction.

In some embodiments of the present disclosure, for the any one of the multiple optical modulation units: when any two prisms have the same distances from the centerline of the corresponding pixel unit in the first direction, the any two prisms have same vertical heights in the first direction.

In some embodiments of the present disclosure, for any one of the multiple optical modulation units: the multiple prisms have same vertical heights in the first direction, and when any two prisms have different distances from the centerline of the corresponding pixel unit in the first direction, the any two prisms have different horizontal lengths in a second direction.

In some embodiments of the present disclosure, for the any one of the multiple optical modulation units: when any two prisms have same distances from the centerline of the corresponding pixel unit in the first direction, the any two prisms have same horizontal lengths in the second direction.

In some embodiments of the present disclosure, when the preset angle is 0 degree, a horizontal length of the prism in the second direction and a vertical height of the prism in the first direction satisfy the following formula:

$$l2 = [h2\sqrt{n2^2(l1^2+h1^2)-l1^2 n1^2} - n1 \times h2 \sqrt{l1^2+h1^2}]/(n1 \times l1)$$

where l2 is the horizontal length of the prism in the second direction, l1 is a horizontal distance between the prism and the centerline of the corresponding pixel unit in the first direction, h1 is a vertical distance between the pixel unit and the prism in the first direction, h2 is the vertical height of the prism in the first direction, n1 is a refractive index of the light in air, and n2 is a refractive index of the light in the prism.

In some embodiments of the present disclosure, the vertical height of the prism in the first direction ranges from 50 microns (μm) to 150 nm.

In some embodiments of the present disclosure, for any one of the multiple optical modulation units, the multiple prisms are symmetrically arranged with respect to a centerline of the corresponding pixel unit, and the centerline is parallel to a first direction.

In some embodiments of the present disclosure, the multiple prisms in the optical modulation unit are arranged in a zigzag shape.

In some embodiments of the present disclosure, the display panel is an LCD (Liquid Crystal Display) display panel or an OLED (Organic Light-Emitting Diode) display panel.

The present disclosure also provides a method for manufacturing a display device, including:
providing a display panel including multiple pixel units; and
forming an optical modulation component on a light-emitting side of the display panel, the optical modulation component includes multiple optical modulation units in one-to-one correspondence with the multiple pixel units, each of the multiple optical modulation units includes multiple prisms for refracting light emitted by the corresponding pixel unit so that the refracted light exits at a preset angle.

In some embodiments of the present disclosure, the forming the optical modulation component on the light-emitting side of the display panel includes:
coating a photoresist material on the light-emitting side of the display panel; and
forming the photoresist material into the multiple optical modulation units by using a mask with graded transmittance;
the multiple prisms in the optical modulation unit are arranged in a zigzag shape.

In some embodiments of the present disclosure, for any one of the multiple optical modulation units: the multiple prisms have same vertical heights in a first direction, and when any two prisms have different distances from a centerline of the corresponding pixel unit in the first direction, the any two prisms have different horizontal lengths in a second direction.

In some embodiments of the present disclosure, for any one of the multiple optical modulation units: the multiple prisms have same horizontal length in a second direction, and when any two prisms have different distances from a centerline of the corresponding pixel unit in a first direction, the any two prisms have different vertical heights in the first direction.

BRIEF DESCRIPTION OF THE DRAWINGS

In order that the technical solutions of the embodiments of the present disclosure are more clearly described, the accompanying drawings required for describing the embodiments of the present disclosure will be briefly described. It will be apparent that the accompanying drawings in the following descriptions are merely some of the embodiments of the present disclosure, and other drawings may be obtained by those of ordinary skill in the art based on these drawings without any creative efforts.

DETAILED DESCRIPTION

In order to facilitate understanding of the above objects, features and advantages of the present disclosure, the present disclosure will be described in further detail hereinafter in conjunction with the accompanying drawings and specific embodiments.

In the related technologies, privacy protection can be realized by providing an anti-peeping film outside a display device. The anti-peeping film absorbs light at a large angle and transmits light at a small angle based on the shading principle of blinds, so as to prevent peeking.

However, in an anti-peeping method in the related technologies which prevents peeping by means of an anti-peeping film, since light at a large angle is blocked and absorbed, light at the large angle is lost, and only a part of light is received by human eyes, which greatly reduces the utilization rate of light energy. In order to meet the usage requirement of brightness of the display device, high power consumption is often required.

In view of the above, the present disclosure provides a display device and a manufacturing method thereof.

Figure 1:
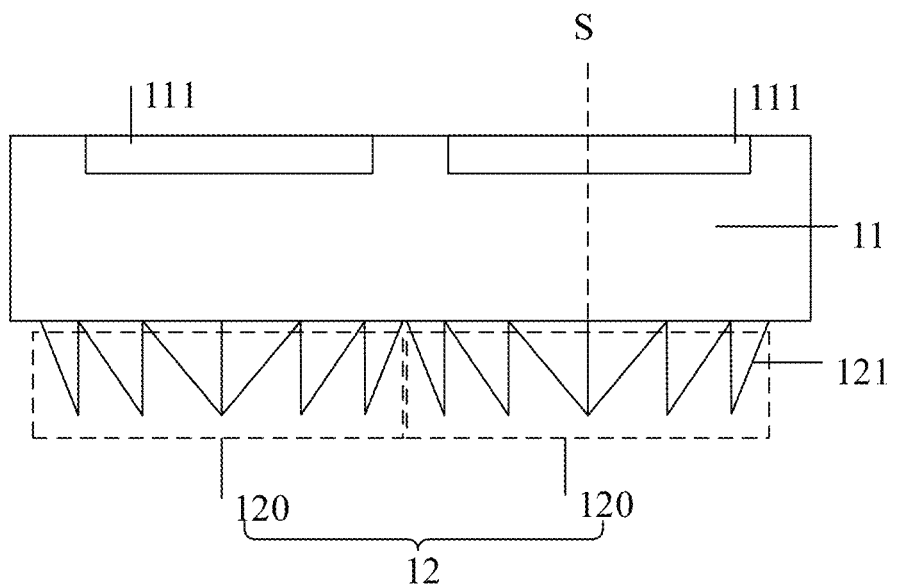
FIG. 1 is a schematic structural diagram of a display device according to some embodiments of the present disclosure.

Reference is made to FIG. 1, which is a schematic structural diagram of a display device according to some embodiments of the present disclosure.

Embodiments of the present disclosure provide a display device, including a display panel 11 and an optical modulation component 12 disposed on a light-emitting side of the display panel 11. The display panel 11 includes multiple pixel units 111. The optical modulation component 12 includes optical modulation units 120 in one-to-one correspondence with the pixel units 111. Each optical modulation unit 120 includes multiple prisms 121. The prism 121 is configured to refract light emitted from the corresponding pixel unit 111 so that the refracted light exits at a preset angle.

The multiple pixel units 111 are provided in the display panel 11, for emitting light with corresponding colors, so that a user can see displayed information in the display panel 11. Generally, light rays emitted by the pixel unit 111 not only include light rays having a small angle, such as an angle of 10 degrees between the exiting direction of the light rays and the normal line of the display panel 11, but also include light rays having a large angle, such as an angle of 80 degrees between the exiting direction of the light rays and the normal line of the display panel 11. When the angle between the position of the viewer and the normal line of the display panel 11 is within the range of the light rays emitted by the pixel unit 111, the viewer can see information displayed on the display panel 11, thereby causing information leakage.

In the embodiments of the present disclosure, the multiple optical modulation units 120 are provided on the light-emitting side of the display panel 11; each optical modulation unit 120 includes the multiple prisms 121. Light emitted from the pixel unit 111 is incident on the light-entering side of the prism 121. Since the refractive index of the light in the prism 121 is different from the refractive index of the light in the air, the light emitted from the pixel unit 111 is refracted at the light-entering side of the prism 121, and the refracted light enters the prism 121, and is refracted again at the light-exiting surface of the prism 121, and then exits from the light-exiting surface of the prism 121 at the preset angle.

The multiple optical modulation units 120 are provided on the light-emitting side of the display panel 11, and each optical modulation unit 120 includes the multiple prisms 121. In this way, the exiting direction of light rays can be accurately controlled, and light rays with a large angle are converted into light rays exiting at the preset angle by refraction, so that the viewing angle of the display device is narrowed, thereby preventing peeping. In addition, the light rays with a large angle can also be received by human eyes, so that the utilization rate of light can be improved, and the power consumption of the display device can be reduced.

The preset angle is an angle between the light exiting from the light-exiting surface of the prism 121 and the normal line of the display panel 11, and the preset angle may range from 0 degree to 45 degrees.

By controlling the structure of the prism 121, the preset angle may be controlled between 0 degree and 45 degrees. In this way, when the angle between the position of the viewer and the normal line of the display panel 11 is greater than 45 degrees, the light rays emitted from the pixel unit 111 are not received, that is, the information displayed on the display panel 11 cannot be seen, thereby preventing peeping. Generally, when the user uses the display device, the angle between the position of the user and the normal line of the display panel 11 is small, which is generally smaller than 45 degrees, so that light rays emitted from the pixel unit 111 can be received, that is, the information displayed on the display panel 11 can be normally seen. In embodiments of the present disclosure, the preset angle is not limited to 0 degree to 45 degrees. The preset angle may also be another angle set according to actual requirements, as long as the optical modulation component narrows the viewing angle of the display device to realize the function of preventing peeping.

Specifically, for any one of the optical modulation units 120, when any two of the prisms 121 have different distances from the centerline S of the corresponding pixel unit 111 in the first direction, the first angles of the any two prisms 121 may be different, where the first angle is an angle between the light-entering surface and the light-exiting surface of the prism 121. For any one of the optical modulation units 120, when any two of the prisms 121 have different distances from the centerline S of the corresponding pixel unit 111 in the first direction, i.e., any two of the prisms 121 having different distances from the corresponding pixel unit 111 in a direction perpendicular to the first direction, incident angles at which the light rays emitted by the pixel unit 111 are incident on the light-entering surfaces of the any two prisms 121 may be different. In order that the light rays emitted by the pixel unit 111 substantially exit at the same preset angles, the structures of the multiple prisms 121 in the same optical modulation unit 120 provided on the light-emitting side of the display panel 11 may be different. For example, the angles between the light-entering surfaces and the light-exiting surfaces of the prisms 121 may be controlled to be different, so that the light rays exiting from the light-exiting surfaces of the prisms 121 exit at the same preset angles.

Figure 6:
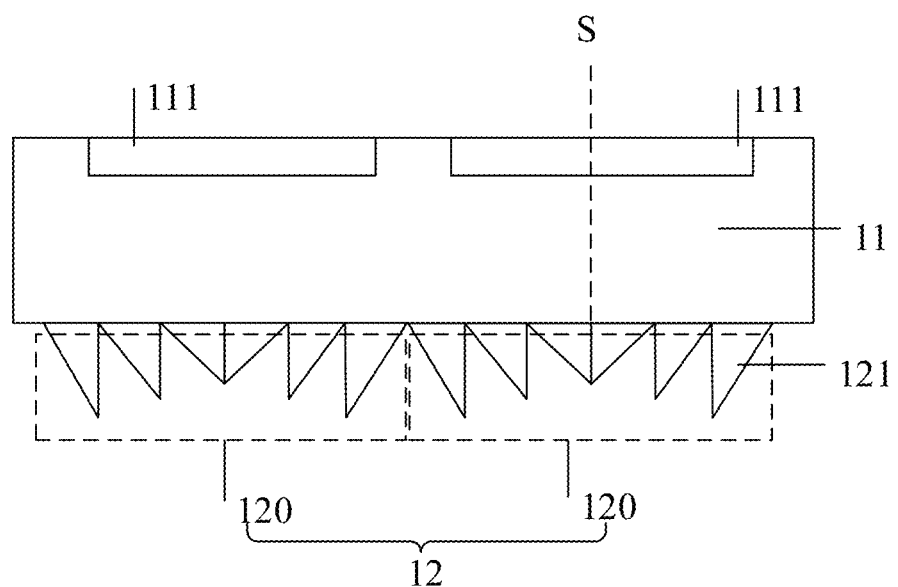
FIG. 6 is a schematic structural diagram of a display device according to some embodiments of the present disclosure.

In some embodiments of the present disclosure, for any one of the optical modulation units 120: horizontal lengths of the multiple prisms 121 in the second direction may all be the same; and vertical heights of any two prisms 121 in the first direction are different when the any two prisms 121 have different distances from the centerline S of the corresponding pixel unit 111 in the first direction. For example, as shown in FIG. 6, for any one of the optical modulation units 120, when any two prisms 121 have different distances from the centerline S of the corresponding pixel unit 111, vertical heights of the any two prisms 121 in the first direction are different. Further, in some embodiments, for any one of the optical modulation units, the vertical heights of any two prisms in the first direction are the same when the any two prisms have same distances from the centerline of the corresponding pixel units in the first direction.

In some other embodiments of the present disclosure, for any one of the optical modulation units 120, the vertical heights of the multiple prisms 121 in the first direction may all be the same, and when any two prisms 121 have different distances from the centerline of the corresponding pixel unit 111 in the first direction, the horizontal lengths of the any two prisms 121 in the second direction are different. For example, as shown in FIG. 1, for any one of the optical modulation units 120, when any two prisms 121 have different distances from the centerline S of the corresponding pixel unit 111, the horizontal lengths of the any two prisms 121 in the second direction are different. Further, in some embodiments, for any one of the optical modulation units, the horizontal lengths of any two prisms in the second direction are the same when the any two prisms have same distances from the centerline of the corresponding pixel unit in the first direction.

Figure 2:
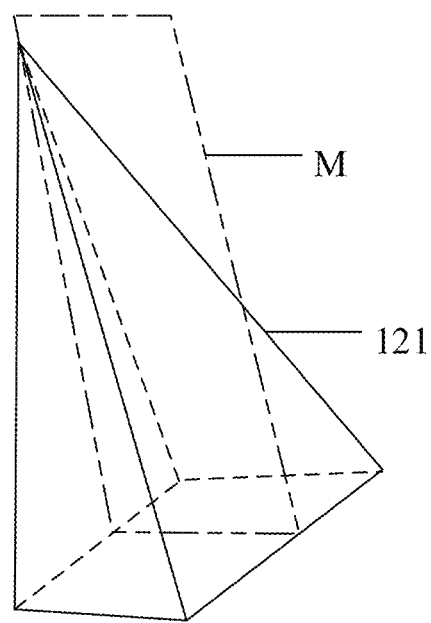
FIG. 2 is a schematic structural diagram of a prism according to some embodiments of the present disclosure.

The prism may be pyramidal in shape. For example, as shown in FIG. 2, the actual structure of the prism may be a right-angled pyramid, a cross-sectional view of the prism 121 shown in FIG. 1 may be obtained along the cross-section M, which is triangular, and the shape of the projection of the prism 121 onto the display panel 11 is rectangular, that is, the top view of the prism 121 is rectangular, where the cross-section M is parallel to one of the sides of the rectangle at the bottom of the prism 121 and passes through the apex of the prism 121. The first direction in the embodiments may be a normal direction of the display panel 11, and the second direction is perpendicular to the first direction and parallel to the long side of the display panel 11. Specifically, the normal direction of the display panel 11 is a direction perpendicular to the light-exiting surface of the display panel 11 facing the user.

The horizontal lengths of the multiple prisms 121 in the second direction are set to be the same, and the vertical heights of the multiple prisms 121 in the first direction are set to be different. Or, the vertical heights of the multiple prisms 121 in the first direction are set to be the same, and the horizontal lengths of the multiple prisms 121 in the second direction are set to be different. In this way, the angles between the light-entering surfaces and the light-exiting surfaces of the prisms 121 are controlled to be different.

The relationship between the horizontal length of the prism 121 in the second direction and the vertical height of the prism 121 in the first direction will be described hereinafter with the example in which the refracted light exits at a preset angle of 0 degree.

Figure 3:
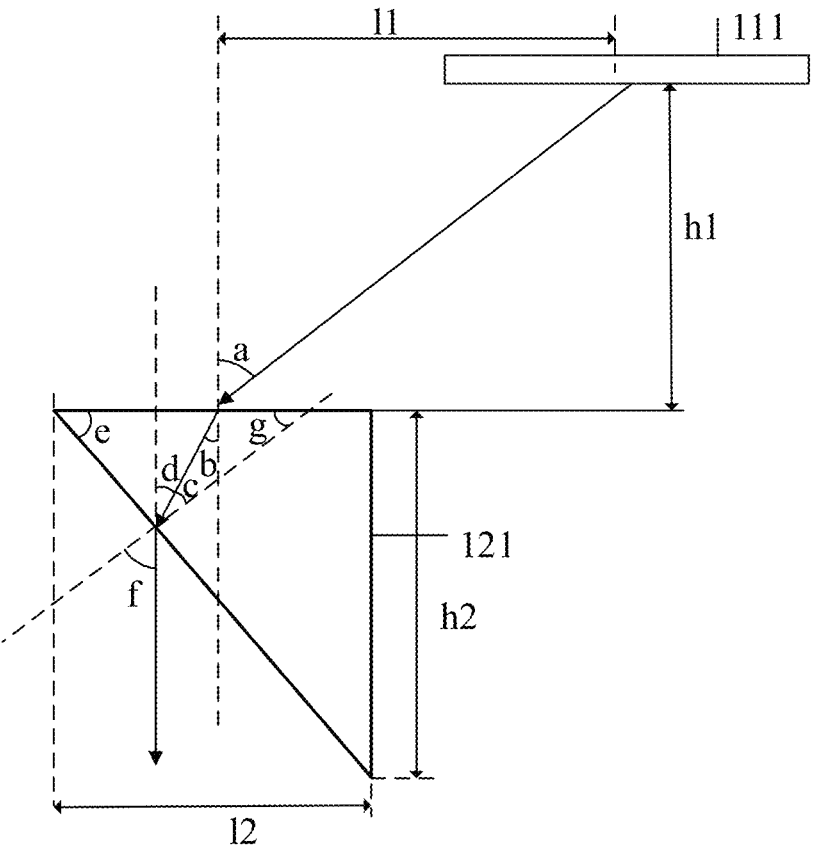
FIG. 3 is a schematic diagram according to some embodiments of the present disclosure where a prism refracts light emitted from a pixel unit so that the refracted light exits at a preset angle of 0 degree.

Reference is made to FIG. 3, which is a schematic diagram of a prism according to some embodiments of the present disclosure for refracting light emitted from a pixel unit so that the refracted light exits at a preset angle of 0 degree.

The incident angle of the light emitted by the pixel unit 111 on the light-entering surface of the prism 121 is a, the light incident on the light-entering surface of the prism 121 is refracted on the light-entering surface of the prism 121, and the refractive angle of the light refracted on the light-entering surface of the prism 121 is b. It can be seen from the refractive index formula that:

$$\sin a/\sin b = n2/n1 \qquad \text{formula (1)}$$

where n1 is the refractive index of the light in the air, and n2 is the refractive index of the light in the prism 121.

The light refracted at the light-entering surface of the prism 121 is incident on the light-exiting surface of the prism 121, and is refracted again. The incident angle of the light incident on the light-exiting surface of the prism 121 is c, and the refractive angle of the light exiting from the light-exiting surface of the prism 121 is f. According to the refractive index formula, it can be seen that:

$$\sin c/\sin f = n1/n2 \qquad \text{formula (2)}$$

In FIG. 3, the angle d is an angle between the light exiting from the light-exiting surface of the prism 121 and the light incident on the light-exiting surface of the prism 121, the angle e is an angle between the light-entering surface of the prism 121 and the light-exiting surface of the prism 121, that is, the first angle, and the angle g is an angle between the normal line of the light-exiting surface of the prism 121 and the light-entering surface of the prism 121.

When the preset angle is 0 degree, the light exiting from the light-exiting surface of the prism 121 is exit light perpendicular to the display panel 11. As can be seen from the angle relationship of the triangle, $g+e=90°$ and $g+c+d=90°$. Therefore, it can be obtained that:

$$e=c+d=f \qquad \text{formula (3)}$$

In addition, from FIG. 3, it can be seen that:

$$d=b \quad \text{formula (4)}$$

According to formula (1), formula (2), formula (3), and formula (4), it can be seen that that:

$$\sin a/\sin b = \sin f/\sin c = \sin f/\sin(f-d) = \sin e/\sin(e-d) = \sin e/\sin(e-b) = \sin e/[\sin e \times \cos b - \cos e \times \sin b] \quad \text{formula (5)}$$

It can be seen from formula (5) that:

$$\sin a = \sin e \times \sin b/[\sin e \times \cos b - \cos e \times \sin b] = 1/(\cot b - \cot e) \quad \text{formula (6)}$$

As can be seen from FIG. 3:

$$\sin a = l1/\sqrt{l1^2 + h1^2} \quad \text{formula (7)}$$

where l1 is the horizontal distance between the prism 121 and the centerline of the corresponding pixel unit 111 in the first direction, and h1 is the vertical distance between the pixel unit 111 and the prism 121 in the first direction.

As can be seen from formula (1) and formula (7):

$$\sin b = n1 \times l1/(\sqrt{l1^2 + h1^2} \times n2) \quad \text{formula (8)}$$

Therefore, $$\cos b = \sqrt{1 - \sin b^2} = \sqrt{1 - \frac{n1 \times n1 \times l1 \times l1}{(l1 \times l1 + h1 \times h1) \times n2 \times n2}} \quad \text{formula (9)}$$

In addition, $$\cot b = \cos b/\sin b; \cot e = l2/h2 \quad \text{formula (10)}$$

where h2 is the vertical height of the prism 121 in the first direction, and l2 is the horizontal length of the prism 121 in the second direction.

According to the formulas (7), (8), (9) and (10), when the preset angle is 0 degree, the horizontal length of the prism 121 in the second direction and the vertical height of the prism 121 in the first direction need to satisfy the following formula:

$$l2 = [h2\sqrt{n2^2(l1^2+h1^2)-l1^2 n1^2} - n1 \times h2 \sqrt{l1^2+h1^2}]/(n1 \times l1) \quad \text{formula (11)}$$

When the vertical heights of the multiple prisms 121 in the first direction are the same, sizes of the first angles e may be controlled by controlling the horizontal lengths of the prisms 121 in the second direction. When the horizontal lengths of the multiple prisms 121 in the second direction are the same, sizes of the first angles e may be controlled by controlling the vertical heights of the prisms 121 in the first direction.

For the pixel units 111 of the display panel 11, each pixel unit 111 has the same vertical distances h1 from the prisms 121 in the first direction, and the vertical heights h2 of the multiple prisms 121 in the first direction are equal. When the prisms 121 have different horizontal distances l1 from the centerline of the corresponding pixel unit 111 in the first direction, the horizontal lengths l2 of the prisms 121 in the second direction calculated according to the formula (11) are different. Therefore, the horizontal length l2 of each prism 121 in the second direction provided on the light-emitting side of the display panel 11 can be obtained, whereby the prisms 121 are manufactured.

Or, for the pixel units 111 of the display panel 11, each pixel unit 111 has the same vertical distances h1 from the prisms 121 in the first direction, and the horizontal lengths l2 of the multiple prisms 121 in the second direction are equal. When the prisms 121 have different horizontal distances l1 from the centerline of the corresponding pixel unit 111 in the first direction, the vertical heights h2 of the prisms 121 in the first direction calculated according to the formula (11) are different. Therefore, the vertical height h2 of each prism 121 in the first direction provided on the light-emitting side of the display panel 11 can be obtained, whereby the prisms 121 are manufactured.

It should be noted that in the above analysis process, only the light rays emitted by one pixel unit 111 in the display panel 11, which are capable of exiting at the preset angle of 0 degree, are described, it is understood that the light rays emitted by the pixel units 111 at other positions can also exit at the preset angle based on the multiple prisms 121 in the optical modulation units 120 at the corresponding positions, so that most of the light rays can exit at the preset angle.

When the preset angle is another angle, it is also feasible to determine a formula that the horizontal length of the prism 121 in the second direction and the vertical height of the prism 121 in the first direction need to satisfy according to the analysis procedure described above.

In addition, vertical distance h1 between the pixel unit 111 and the prism 121 in the first direction is mainly caused by a structure between the pixel unit 111 and the light-emitting side of the display panel 11, such as a package cover plate.

In some embodiments of the present disclosure, the vertical heights of the multiple prisms 121 in the first direction may be the same, and the vertical height of the prism 121 in the first direction may range from 50 μm to 150 μm.

In some embodiments of the present disclosure, for any one of the optical modulation units 120, the multiple prisms 121 are symmetrically arranged with respect to the centerline of the corresponding pixel unit 111, and the centerline extends in the first direction. In some embodiments of the present disclosure, the multiple prisms 121 in the optical modulation unit 120 are arranged in a zigzag configuration. The display panel 11 may be an LCD display panel or an OLED display panel, and the embodiments of the present disclosure are not limited thereto.

In the embodiments of the present disclosure, the optical modulation component is provided on the light-emitting side of the display panel, the optical modulation component includes the optical modulation units in one-to-one correspondence with the pixel units in the display panel, and the optical modulation unit includes the multiple prisms each being configured to refract light emitted from the pixel unit so that the refracted light exits at the preset angle. Based on the multiple optical modulation units provided on the light-emitting side of the display panel, each of which includes the multiple prisms, the exiting directions of light rays can be accurately controlled, and light rays with large angles are converted into light rays exiting at the preset angle by refraction, so that the viewing angle of the display device is narrowed, which realizes the function of preventing peeping. In addition, since the light rays with large angles are received by human eyes, the utilization rate of light can be improved, and the power consumption of the display device can be reduced.

In some embodiments of the present disclosure, the display device may be any product or component having a display function, such as a mobile phone, a tablet computer, a television, a notebook computer, a digital photo frame, a navigator, or the like. The display device further includes a flexible circuit board, a printed circuit board, and a back plate.

Figure 4:
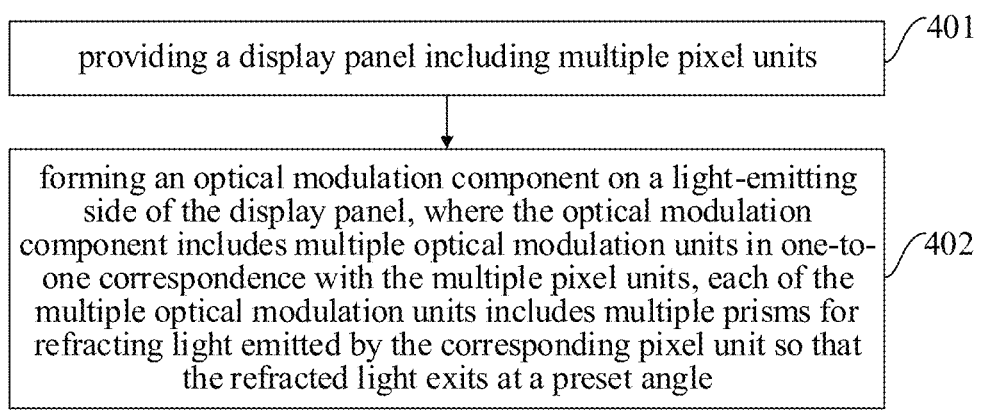
FIG. 4 is a flowchart of a method for manufacturing a display device according to some embodiments of the present disclosure.

Reference is made to FIG. 4, which is a flowchart of a method for manufacturing a display device according to some embodiments of the present disclosure. The display device may be the display device described in the above embodiments. The method may specifically include steps 401 to 402.

In step 401, a display panel including multiple pixel units is provided.

In the embodiments of the present disclosure, the display panel 11, which may be an LCD display panel or an OLED display panel, needs to be made when forming the display device. The display panel 11 includes multiple pixel units 111, and the multiple pixel units 111 may be arranged in an array.

In step 402, an optical modulation component is formed on a light-emitting side of the display panel, the optical modulation component includes optical modulation units in one-to-one correspondence with the pixel units, and each of the optical modulation units includes multiple prisms to refract light emitted by the corresponding pixel unit so that the refracted light exits at a preset angle.

In the embodiments of the present disclosure, the optical modulation component 12 is formed on the light-emitting side of the display panel 11. The optical modulation component 12 includes the optical modulation units 120 in one-to-one correspondence with the pixel units 111. Each optical modulation unit 120 includes the multiple prisms 121. The prisms 121 may refract light emitted from the pixel unit 111 in the display panel 11 so that the refracted light exits at the preset angle.

Specifically, the light-emitting side of the display panel is coated with a photoresist material; and the photoresist material is formed into the multiple optical modulation units by using a mask with graded transmittance; where the multiple prisms in the optical modulation unit are arranged in a zigzag shape. For any one optical modulation unit, the multiple prisms have same vertical heights in a first direction, and when any two prisms have different distances from a centerline of the corresponding pixel unit in the first direction, the any two prisms have different horizontal lengths in a second direction. Or, for any one of the optical modulation units, the multiple prisms have same horizontal lengths in a second direction, and when any two prisms have different distances from a centerline of the corresponding pixel unit in a first direction, the any two prisms have different vertical heights in the first direction.

Figure 5:
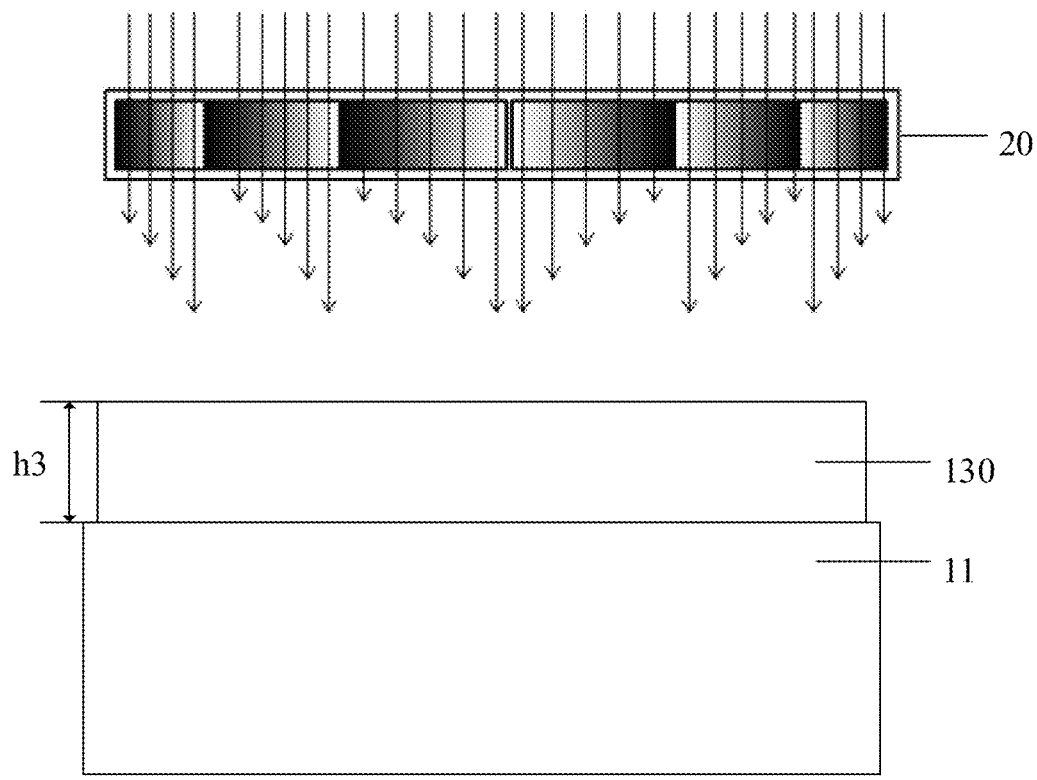
FIG. 5 is a schematic diagram illustrating exposure of a photoresist material using a mask with graded transmittance according to some embodiments of the present disclosure.

Reference is made to FIG. 5, which is a schematic diagram of exposure of a photoresist material by using a mask with graded transmittance in some embodiments of the present disclosure.

As shown in FIG. 5, the light-emitting side of the display panel 11 is coated with the photoresist material 130 having a thickness of h3, and the photoresist material 130 is exposed to ultraviolet light using the mask 20 with the graded transmittance. After the exposure, the photoresist material 130 is developed to obtain the multiple prisms 121 in the optical modulation unit 120 shown in FIG. 1.

It should be noted that the mask 20 with the graded transmittance shown in FIG. 5 is only used to form the multiple prisms 121 in the optical modulation unit 120 corresponding to one pixel unit 111. If the optical modulation units 120 corresponding to the multiple pixel units in the entire display panel 11 are to be formed, the mask corresponding to the entire display panel 11 needs to be an array formed by masks 20 with graded transmittance shown in FIG. 5, and the quantity of the masks is equal to the quantity of pixel units 111 in the display panel 11.

In the actual manufacturing process, the photoresist material may be coated on the package cover plate in the display panel 11, and the photoresist material is exposed with ultraviolet light by using the mask with the graded transmittance. After the exposure, the photoresist material is developed to form the multiple optical modulation units 120 on the package cover plate, and finally the unpackaged display panel is packaged by using the package cover plate on which the multiple optical modulation units 120 are formed.

The coating thickness h3 of the photoresist material is greater than or equal to the vertical height h2 of the prism 121 in the first direction; and the vertical height of the prism 121 in the first direction ranges from 50 μm to 150 μm.

It should be noted that the mask 20 with the graded transmittance shown in FIG. 5 includes multiple pattern regions, a prism 121 is formed corresponding to each pattern region, and the transmittance of each pattern gradually increases or gradually decreases.

The photoresist material may be a positive photoresist material or a negative photoresist material. When the photoresist material is a negative photoresist material, the thickness of the photoresist material after development is large at a region where ultraviolet light transmittance is high, and the thickness of the photoresist material after development is small at a region where ultraviolet light transmittance is low. When the photoresist material is a positive photoresist material, the thickness of the photoresist material after development is small at a region where ultraviolet light transmittance is high, and the thickness of the photoresist material after development is large at a region where ultraviolet light transmittance is low.

It should be noted that the manufacturing method shown in FIG. 5 is applicable to a case where the vertical heights of the multiple prisms 121 in the first direction are the same, and the horizontal lengths of any two prisms 121 in the second direction are different for any one of the optical modulation units 120 when the any two prisms 121 have different distances from the centerline of the corresponding pixel unit 111 in the first direction.

In the embodiments of the present disclosure, the display panel is provided, and the optical modulation component is formed on the light-emitting side of the display panel, where the optical modulation component includes the optical modulation units in one-to-one correspondence with the pixel units, and each optical modulation unit includes the multiple prisms to refract light emitted from the pixel unit so that the refracted light exits at the preset angle. Based on the multiple optical modulation units provided on the light-emitting side of the display panel, each of which includes the multiple prisms, the exiting directions of light rays can be accurately controlled, and light rays with large angles are converted into light rays exiting at the preset angle by refraction, so that the viewing angle of the display device is narrowed, which realizes the function of preventing peeping. In addition, since the light rays with large angles are received by human eyes, the utilization rate of light can be improved, and the power consumption of the display device can be reduced.

For the purpose of simplicity of description, the method embodiments in the above are expressed as a series of combinations of acts. However, it will be appreciated by those skilled in the art that the present disclosure is not limited by the order of acts as described, as certain steps may be performed in other orders or simultaneously in accordance with the present disclosure. Second, those skilled in the art should also appreciate that the embodiments described in the specification are all optional embodiments, and the acts and modules involved are not necessarily required by the present disclosure.

The various embodiments in this specification are described in a progressive manner, each of which focuses on differences from the other embodiments, and reference may be made to each other for the same or similar parts between the various embodiments.

Finally, it should also be noted that in this specification, relational terms such as first and second and the like are merely used to distinguish an entity or operation from another entity or operation, without necessarily requiring or implying any such actual relationship or order between such entities or operations. Moreover, the terms "having," "comprising," or any other variation thereof, are intended to cover a non-exclusive inclusion, such that a process, method, article, or apparatus that comprises a list of elements includes not only those elements but also other elements not expressly listed, or also includes elements inherent to such process, method, article, or apparatus. Without more limitations, an element defined by the statement "include a . . . " does not rule out there are additional identical elements in the process, method, article or apparatus including the element.

The display device and the method for manufacturing the same according the present disclosure are described in detail in the above. Specific examples are used herein to illustrate the principles and embodiments of the present disclosure. The above descriptions of the embodiments are merely intended to assist in understanding the method and the core idea of the present disclosure. In addition, for those of ordinary skill in the art, there can be changes in the specific implementations and scope of the present disclosure according to the idea of the present disclosure. In summary, this specification should not be construed as limiting the present disclosure.

What is claimed is:

1. A display device, comprising a display panel and an optical modulation component on a light-emitting side of the display panel;
    wherein the display panel comprises a plurality of pixel units, the optical modulation component comprises a plurality of optical modulation units in one-to-one correspondence with the plurality of pixel units, and each of the plurality of optical modulation units comprises a plurality of prisms;
    wherein the prism is configured to refract light emitted by the corresponding pixel unit so that the refracted light exits at a preset angle; and
    wherein, for any one of the plurality of optical modulation units: when any two of the prisms have different distances from a centerline of the corresponding pixel unit in a first direction, first angles of the any two prisms are different, wherein the first angle is an angle between a light-entering surface of the prism and the light-exiting surface of the prism;
    wherein the preset angle is an angle between light exiting from a light-exiting surface of the prism and a normal line of the display panel, and the preset angle ranges from 0 degree to 45 degrees; and
    wherein, for any one of the plurality of optical modulation units: the plurality of prisms has same horizontal lengths in a second direction, and when any two prisms have different distances from the centerline of the corresponding pixel unit in the first direction, the any two prisms have different vertical heights in the first direction; or
    wherein, for any one of the plurality of optical modulation units: the plurality of prisms has same vertical heights in the first direction, and when any two prisms have different distances from the centerline of the corresponding pixel unit in the first direction, the any two prisms have different horizontal lengths in a second direction.

2. The display device according to claim 1, wherein, for the any one of the plurality of optical modulation units: when any two prisms have the same distances from the centerline of the corresponding pixel unit in the first direction, the any two prisms have same vertical heights in the first direction.

3. The display device according to claim 1, wherein, for the any one of the plurality of optical modulation units: when any two prisms have same distances from the centerline of the corresponding pixel unit in the first direction, the any two prisms have same horizontal lengths in the second direction.

4. The display device according to claim 1, wherein when the preset angle is 0 degree, a horizontal length of the prism in the second direction and a vertical height of the prism in the first direction satisfy the following formula:

$$l2 = [h2\sqrt{n2^2(l1^2+h1^2) - l1^2 n1^2} - n1 \times h2 \sqrt{l1^2+h1^2}]/(n1 \times l1)$$

where l2 is the horizontal length of the prism in the second direction, l1 is a horizontal distance between the prism and the centerline of the corresponding pixel unit in the first direction, h1 is a vertical distance between the pixel unit and the prism in the first direction, h2 is the vertical height of the prism in the first direction, n1 is a refractive index of the light in air, and n2 is a refractive index of the light in the prism.

5. The display device according to claim 1, wherein the vertical height of the prism in the first direction ranges from 50 μm to 150 μm.

6. The display device according to claim 1, wherein, for any one of the plurality of optical modulation units, the plurality of prisms is symmetrically arranged with respect to a centerline of the corresponding pixel unit, and the centerline is parallel to a first direction.

7. The display device according to claim 1, wherein the plurality of prisms in the optical modulation unit is arranged in a zigzag shape.

8. The display device according to claim 1, wherein the display panel is an LCD display panel or an OLED display panel.

9. A method for manufacturing a display device, comprising:
    providing a display panel comprising a plurality of pixel units; and
    forming an optical modulation component on a light-emitting side of the display panel, wherein the optical modulation component comprises a plurality of optical modulation units in one-to-one correspondence with the plurality of pixel units, each of the plurality of optical modulation units comprises a plurality of prisms for refracting light emitted by the corresponding pixel unit so that the refracted light exits at a preset angle; and
    wherein, for any one of the plurality of optical modulation units: when any two of the prisms have different distances from a centerline of the corresponding pixel unit in a first direction, first angles of the any two prisms are different, wherein the first angle is an angle between a light-entering surface of the prism and the light-exiting surface of the prism;
    wherein the preset angle is an angle between light exiting from a light-exiting surface of the prism and a normal line of the display panel, and the preset angle ranges from 0 degree to 45 degrees;

wherein the forming the optical modulation component on the light-emitting side of the display panel comprises:

coating a photoresist material on the light-emitting side of the display panel; and forming the photoresist material into the plurality of optical modulation units by using a mask with graded transmittance;

wherein the plurality of prisms in the optical modulation unit are arranged in a zigzag shape; and wherein, for any one of the plurality of optical modulation units: the plurality of prisms has same vertical heights in a first direction, and when any two prisms have different distances from a centerline of the corresponding pixel unit in the first direction, the any two prisms have different horizontal lengths in a second direction; or wherein, for any one of the plurality of optical modulation units: the plurality of prisms has same horizontal lengths in a second direction, and when any two prisms have different distances from a centerline of the corresponding pixel unit in a first direction, the any two prisms have different vertical heights in the first direction.

10. The display device according to claim 2, wherein when the preset angle is 0 degree, a horizontal length of the prism in the second direction and a vertical height of the prism in the first direction satisfy the following formula:

$$l2 = [h2\sqrt{n2^2(l1^2+h1^2)-l1^2 n1^2} - n1 \times h2 \sqrt{l1^2+h1^2}]/(n1 \times l1)$$

where l2 is the horizontal length of the prism in the second direction, l1 is a horizontal distance between the prism and the centerline of the corresponding pixel unit in the first direction, h1 is a vertical distance between the pixel unit and the prism in the first direction, h2 is the vertical height of the prism in the first direction, n1 is a refractive index of the light in air, and n2 is a refractive index of the light in the prism.

11. The display device according to claim 1, wherein when the preset angle is 0 degree, a horizontal length of the prism in the second direction and a vertical height of the prism in the first direction satisfy the following formula:

$$l2 = [h2\sqrt{n2^2(l1^2+h1^2)-l1^2 n1^2} - n1 \times h2 \sqrt{l1^2+h1^2}]/(n1 \times l1)$$

where l2 is the horizontal length of the prism in the second direction, l1 is a horizontal distance between the prism and the centerline of the corresponding pixel unit in the first direction, h1 is a vertical distance between the pixel unit and the prism in the first direction, h2 is the vertical height of the prism in the first direction, n1 is a refractive index of the light in air, and n2 is a refractive index of the light in the prism.

12. The display device according to claim 3, wherein when the preset angle is 0 degree, a horizontal length of the prism in the second direction and a vertical height of the prism in the first direction satisfy the following formula:

$$l2 = [h2\sqrt{n2^2(l1^2+h1^2)-l1^2 n1^2} - n1 \times h2 \sqrt{l1^2+h1^2}]/(n1 \times l1)$$

where l2 is the horizontal length of the prism in the second direction, l1 is a horizontal distance between the prism and the centerline of the corresponding pixel unit in the first direction, h1 is a vertical distance between the pixel unit and the prism in the first direction, h2 is the vertical height of the prism in the first direction, n1 is a refractive index of the light in air, and n2 is a refractive index of the light in the prism.

13. The display device according to claim 3, wherein the vertical height of the prism in the first direction ranges from 50 μm to 150 μm.

* * * * *